(12) United States Patent
Kim

(10) Patent No.: US 6,320,175 B1
(45) Date of Patent: Nov. 20, 2001

(54) SIGNAL DETECTING APPARATUS IN A CHARGE COUPLED DEVICE HAVING AN ANGLED FORMED TRANSISTOR

(75) Inventor: Hang Kyoo Kim, Daejon-si (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/496,625

(22) Filed: Feb. 2, 2000

(30) Foreign Application Priority Data

May 25, 1999  (KR) .................................................. 99-18888

(51) Int. Cl.[7] .................................................. H01L 27/00
(52) U.S. Cl. ........................................ 250/208.1; 257/239
(58) Field of Search ............................... 250/208.1, 214 R, 250/214.1; 257/291, 292, 229, 230, 239; 348/294, 311

(56) References Cited

U.S. PATENT DOCUMENTS 6,210,990 * 4/2001 Kwon ..................................... 438/60

* cited by examiner

Primary Examiner—Que T. Le
(74) Attorney, Agent, or Firm—Morgan, Lewis, & Bockius LLP

(57) ABSTRACT

A signal detecting apparatus in a charge coupled device (CCD) is disclosed. A CCD has a photodiode for converting an image signal into an electrical signal charge, a vertical CCD (VCCD) for transferring the signal charge in a vertical direction, a horizontal CCD (HCCD) for transferring the vertically transferred signal charge in a horizontal direction, and a sense amplifier for sensing the signal charge transferred from the HCCD. The disclosed signal detecting apparatus for a CCD includes a floating diffusion region for collecting the signal charges transferred from the HCCD and detecting a voltage formed by the signal charges. A reset gate is formed on one side of the floating diffusion region, and a reset drain is formed on one side of the reset gate opposite to the floating diffusion region. An output gate is formed on the other side of the floating diffusion region. The signal detecting apparatus also includes a transistor having a gate connected to and formed at an angle with respect to a primary axis of the floating diffusion region, the angle being greater than 0° and less than 90°.

20 Claims, 5 Drawing Sheets

SIGNAL DETECTING APPARATUS IN A CHARGE COUPLED DEVICE HAVING AN ANGLED FORMED TRANSISTOR

This application claims the benefit of Korean Application No. 18888/1999 filed May 25, 1999, which is hereby incorporated by reference.

BACKGROUND OF THE INVENTION

1. Field of the Invention

The present invention relates to a CCD (Charge Coupled Device), and more particularly, to a structure of a signal detecting part for a CCD with an improved signal sensitivity.

2. Discussion of the Related Art

In general, a CCD (Charge Coupled Device) is an image sensor which converts an image signal into an electrical signal. It is also called a "CCD image sensor" as the CCD uses a charge coupling in scanning and reading the image signal. The CCD is provided with a photodiode (PD) for converting an image signal into an electrical signal, a VCCD (vertical CCD) for transferring a signal charge converted by the photodiode (PD) in a vertical direction, an HCCD (Horizontal CCD) for transferring the charge transferred from the VCCI) in a horizontal direction, and a sense amplifier (SA) for sensing the signal charge transferred from the HCCD.

In order to improve a sensitivity of the CCI), different methods are suggested. One example is a method for improving a conversion ratio, in which a parasitic capacitance of a signal detecting part is reduced to increase a voltage conversion ratio which can be obtained from a signal charge. Another example is a method for improving a filter factor using a microlens. Because the method for improving a conversion ratio is more fundamental than the method for improving a filter factor of the microlens and the like, the improvement of the conversion ratio should first be considered.

In order to increase a conversion ratio, a parasitic capacitance between a floating diffusion (FD) region and a gate of a transistor in the sense amplifier should be first reduced. Such a parasitic capacitance is dependent on (1) design criteria, such as an FD area and a size of the transistor in the sense amplifier, (2) layout factors, and (3) process conditions. Consequently, in order to minimize a parasitic capacitance of the signal detecting part, different methods for designing a layout are suggested to minimize the amount of overlap between the FD and a metal or polysilicon layer connecting the gate of the transistor in the sense amplifier.

A CCD according to a related art will be explained with reference to the attached drawings. FIG. 1 illustrates an equivalent circuit of a signal detecting part for the CCD according to the related art.

As shown in FIG. 1, the signal detecting part for the CCD according to related art is provided with an N-type BCCD region 12 on a P-well 11 or a P-type substrate. A reset gate 14 is formed over the N-type BCCD region 12 with a gate insulating film 13 therebetween. An output gate 15 is also formed on the N-type BCCD region, spaced apart from the reset gate 14. A floating diffusion region 16 is formed between the reset gate 14 and the output gate 15, and a reset drain region 17 is formed on one side of the reset gate 14 opposite to the floating diffusion region 16. A first transistor M1 is controlled by a voltage detected at the floating diffusion region 16, and a second transistor M2 is connected to the first transistor M1 in series. The first transistor M1 and the second transistor M2 have source followers. In an ideal case, the second transistor M2 becomes a constant current source. Accordingly, an output current is constant when an output voltage Vout is constant. The source of the first transistor M1 always follows a variation of the voltage provided to the gate.

FIG. 2 illustrates a layout of a signal detecting part for a CCD according to the related art. As show in FIG. 2, the layout of the related art signal detecting part shows the gate 21 of the first transistor M1 disposed perpendicular to the floating diffusion region 16. A source region 22 and a drain region 23 are disposed on both sides of the gate 21 of the first transistor M1. A metal layer 24 is disposed on the floating diffusion region 16 for electrical connection between the floating diffusion region 16 and the gate 21 of the first transistor M1. An output gate 15 and a reset gate 14 are disposed on both sides of the floating diffusion region 16. A reset drain 17 is disposed on one side of the reset gate 14 opposite to the floating diffusion region 16.

In the foregoing related art CCD, signal charges generated by incident lights pass through the HCCD and are collected at the floating diffusion region 16. The amount of signal charges collected at the floating diffusion region 16 is Q, providing a voltage V according to Q=C×V. When a high voltage is provided to the reset gate 14, the charges at the floating diffusion region 16 are transferred to the reset drain 17, emptying the floating diffusion region 16 of signal charges and permitting reception of new signal charges. However, for a layout in which the reset gate 14 is disposed as close to the floating diffusion region 16 as possible, defining a source region 22 of the first transistor M1 is difficult because of the limited space available.

Therefore, as shown in FIG. 3, a method for designing a layout is suggested, in which the reset gate 14 is disposed farther away from the floating diffusion region 16 for securing an adequate space for defining the source region 22. However, the layout of FIG. 3 has a larger floating diffusion region 16, resulting in a reduction in the conversion ratio.

Therefore, the signal detecting part for a CCD according to the related art has the following problem. Even though different methods arc suggested to reduce a parasitic capacitance of the signal detecting part by changing a layout, there has been a limitation in reducing the parasitic capacitance of the signal detecting part because the related art layout is determined according to a design rule of a process.

SUMMARY OF THE INVENTION

Accordingly, the present invention is directed to a structure of a signal detecting part for a CCD that substantially obviates one or more of the problems due to limitations and disadvantages of the related art.

An object of the present invention is to provide a structure of a signal detecting part for a CCD which results in a reduced parasitic capacitance of a signal detecting part.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve and these and other advantages and in accordance with the purpose of the present invention, as embodied and broadly described, a signal detecting apparatus in a charge coupled device (CCD), which has a photodiode for converting an image signal into an electrical signal charge, a vertical CCD (VCCD) for transferring the signal charge in a vertical direction, a horizontal CCD (HCCD) for transferring the vertically transferred signal charge in a horizontal direction, and a sense amplifier for sensing the signal charge transferred from the HCCD, comprises: a floating diffusion region for collecting the signal charges transferred from the HCCD and detecting a voltage formed by the signal charges; a reset gate on one side of the floating diffusion region; a reset drain on one side of the reset gate opposite to the floating diffusion region; an output gate formed on the other side of the floating diffusion region; and a transistor having a gate connected to and formed at an angle with respect to a primary axis of the floating diffusion region the angle being greater than 0° and less than 90°.

In another aspect of the present invention, a signal detecting apparatus in a charge coupled device (CCD), which has a photodiode for converting an image signal into an electrical signal charge, a vertical CCD (VCCD) for transferring the signal charge in a vertical direction, a horizontal CCD (HCCD) for transferring the vertically transferred signal charge in a horizontal direction, and a sense amplifier for sensing the signal charge transferred from the HCCD, comprises: a floating diffusion region for collecting the signal charges transferred from the HCCD and detecting a voltage formed by the signal charges; a reset gate on one side of the floating diffusion region; a reset drain on one side of the reset gate opposite to the floating diffusion region; an output gate formed on the other side of the floating diffusion region; a transistor having a gate connected to the floating diffusion region; and a metal layer electrically connecting the gate of the transistor to the floating diffusion region and extending in a first direction, wherein the gate of the transistor is formed at an angle greater than 0° and less than 90° with respect to the first direction.

In yet another aspect of the present invention, a signal detecting apparatus in a charge coupled device (CCD), which has a photodiode for converting an image signal into an electrical signal charge, a vertical CCD (VCCD) for transferring the signal charge in a vertical direction, a horizontal CCD (HCCD) for transferring the vertically transferred signal charge in a horizontal direction, and a sense amplifier for sensing the signal charge transferred from the HCCD, comprises: a floating diffusion region for collecting the signal charges transferred from the HCCD and detecting a voltage formed by the signal charges; a reset gate on one side of the floating diffusion region; a reset drain on one side of the reset gate opposite to the floating diffusion region; an output gate formed on the other side of the floating, diffusion region; and a transistor having a gate connected to the floating diffusion region, the gate of the transistor having, first portion connected to the floating diffusion region and a second portion extending from the first portion, wherein at least one of the first and second portions of the gate of the transistor is formed at an angle greater than 0° and less than 90° with respect to a primary axis of the floating diffusion region.

In a further aspect of the present invention, a signal detecting apparatus in a charge coupled device (CCD), which has a photodiode for converting an image signal into an electrical signal charge, a vertical CCD (VCCD) for transferring the signal charge in a vertical direction, a horizontal CCD (HCCD) for transferring the vertically transferred signal charge in a horizontal direction, and a sense amplifier for sensing the signal charge transferred from the HCCD, comprises: a floating diffusion region for collecting the signal charges transferred from the HCCD and detecting a voltage formed by the signal charges; a reset gate on one side of the floating diffusion region; a reset drain on one side of the reset gate opposite to the floating diffusion region; an output gate formed on the other side of the floating diffusion region; a transistor having a gate connected to the floating diffusion region, the gate of the transistor having first portion connected to the floating diffusion region and a second portion extending from the first portion; and a metal layer electrically connecting the first portion of the gate of the transistor to the floating diffusion region and extending in a first direction, wherein at least one of the first and second portions of the gate of the transistor is formed at an angle greater than 0° and less than 90° with respect to the first direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying, drawings.

Figure 1:
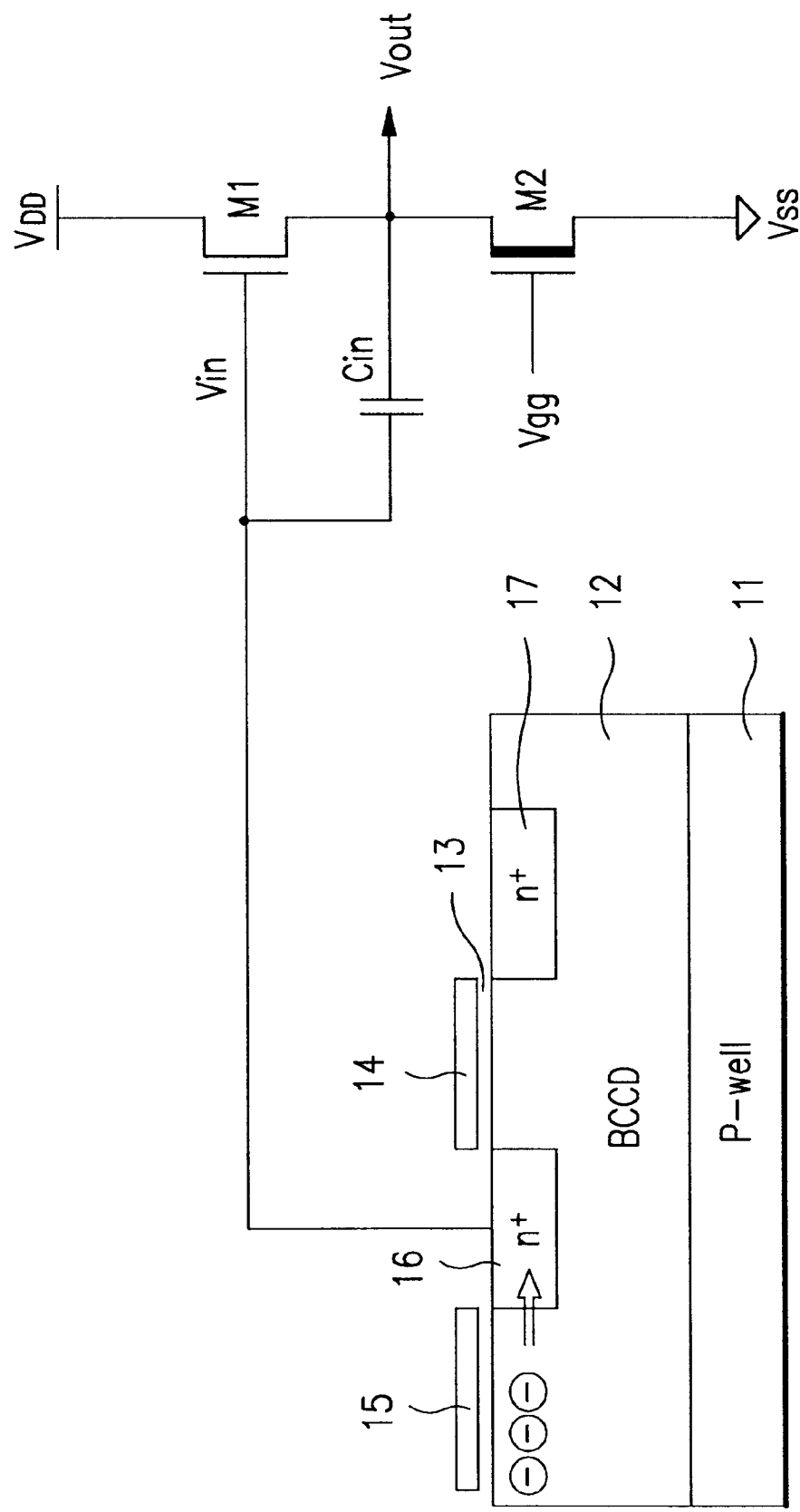
FIG. 1 illustrates an equivalent circuit of a signal detecting part for a related art CCD.
Figure 2:
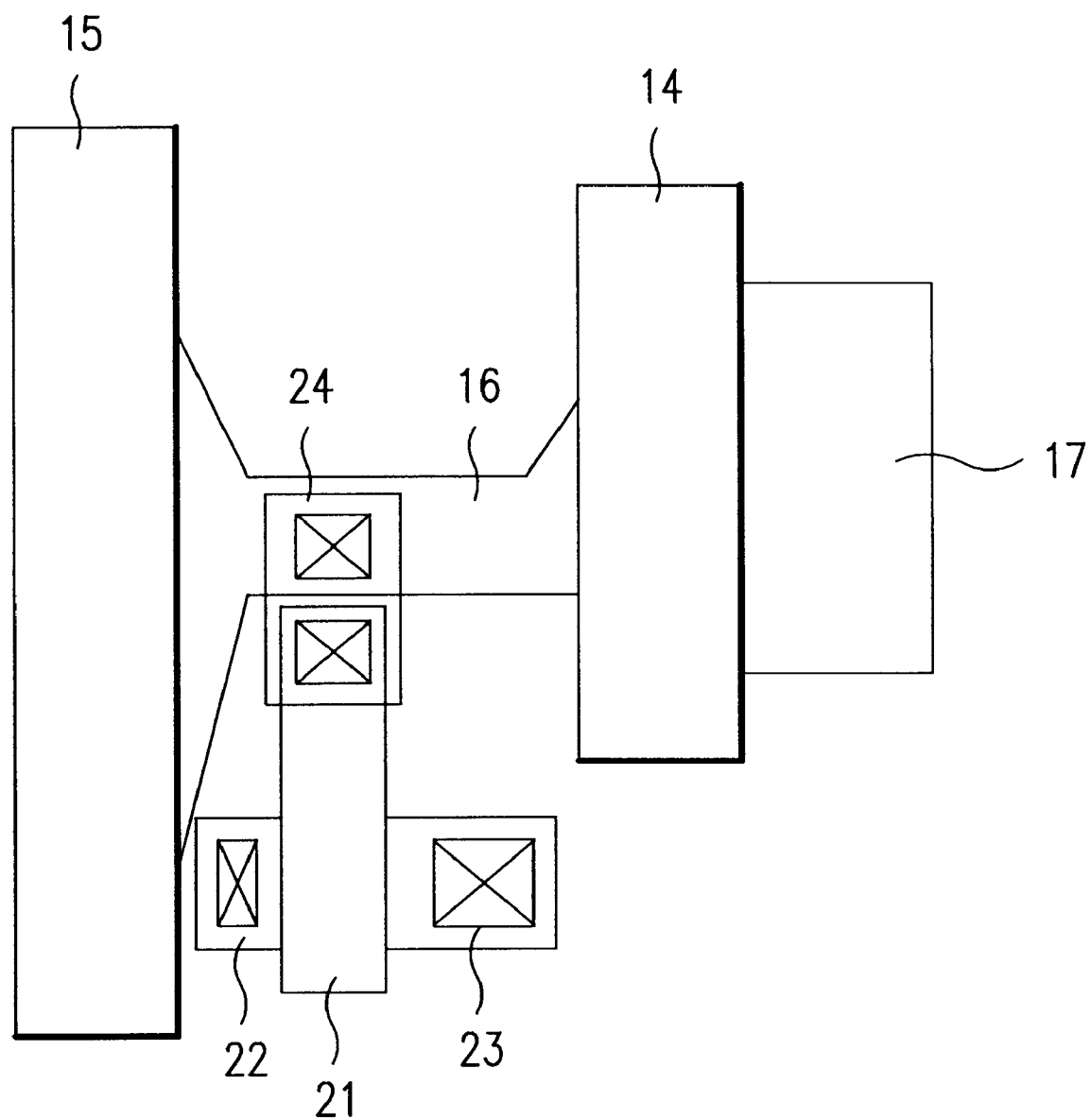
FIG. 2 illustrates an example of layout of a signal detecting part for the related art CCD.
Figure 3:
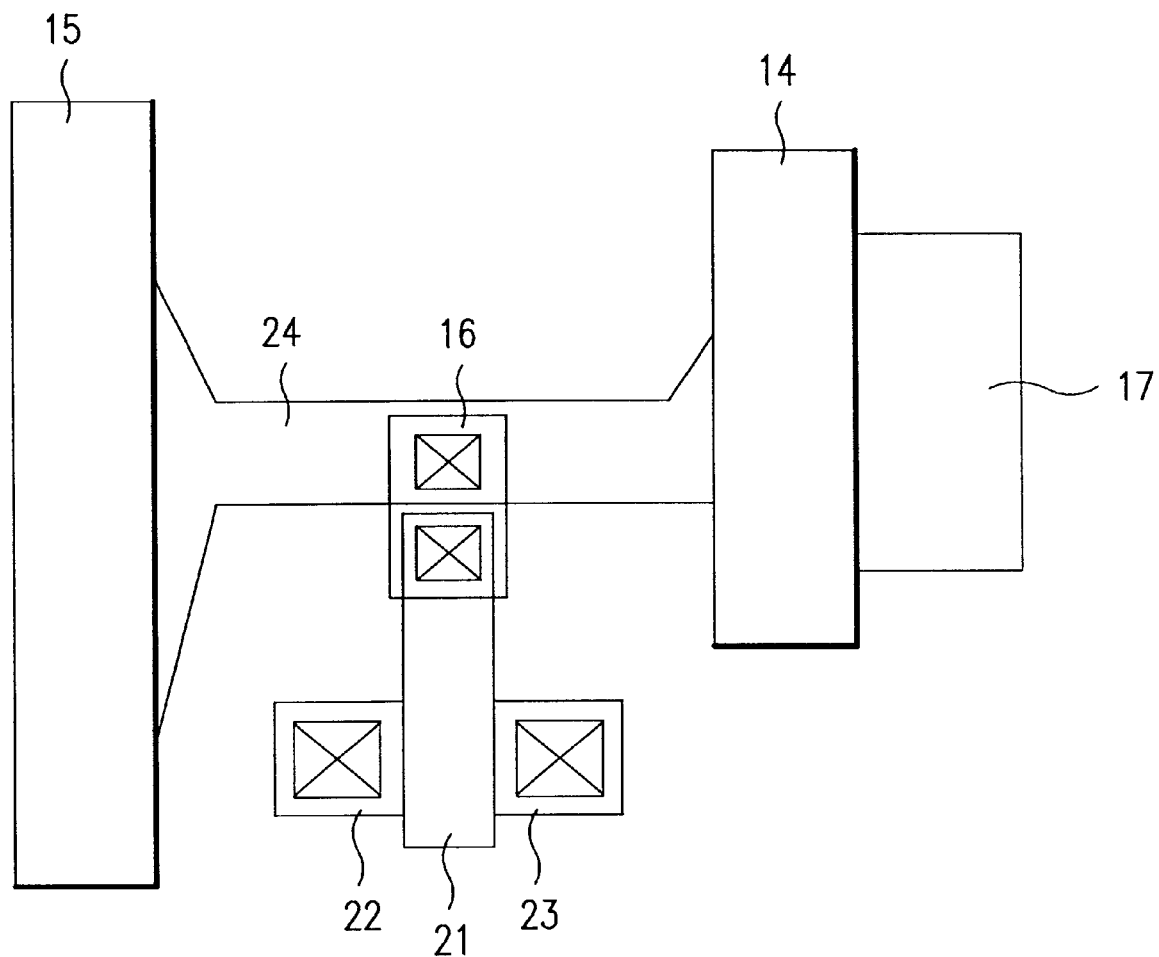
FIG. 3 illustrates another example of layout of a signal detecting part for the related art CCD.
Figure 4:
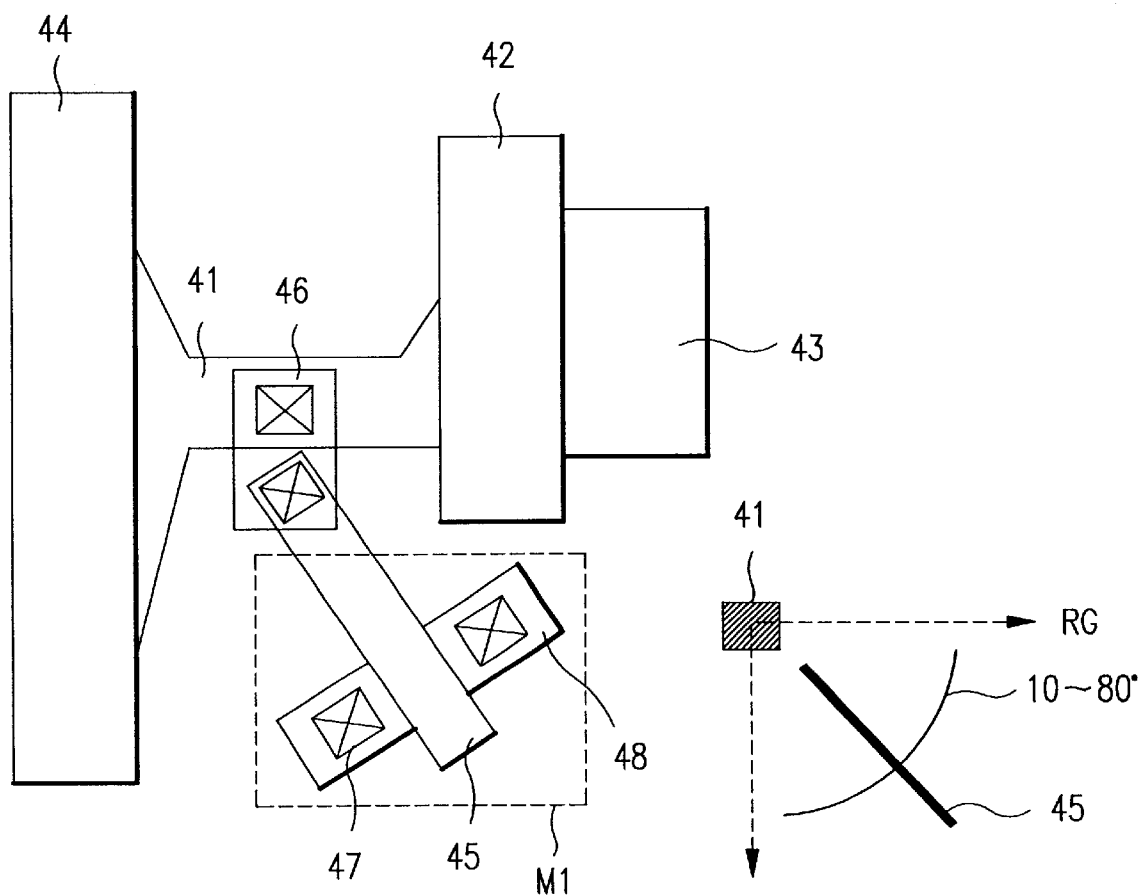
FIG. 4 illustrates a layout of a signal detecting part for a CCD in accordance with a preferred embodiment of the present invention.

FIG. 4 illustrates a layout of a signal detecting part for a CCD in accordance with a preferred embodiment of the present invention. The CCD has photodiode (PD) for converting all image signal into an electrical signal charge, a VCCD for transferring the signal charge in a vertical direction, an HCCD for transferring the signal charge transferred in the vertical direction in a horizontal direction, and a sense amplifier SA for sensing the signal charge transferred from the HCCD. The signal detecting part of the CCD includes a floating diffusion region 41 for collecting the signal charges transferred from the HCCD and detecting a voltage formed by the signal charges, a reset gate 42 on one side of the floating diffusion region 41, a reset drain 43 on one side the reset gate 42 opposite to the floating diffusion region 41, an output gate 44 formed on the other side of the floating diffusion region 41, and a transistor M1 formed at an angle, for example, 45°, with respect to the floating diffusion region 41. The transistor M1 has a gate 45 connected to the floating diffusion region 41 for being controlled by the voltage detected at the floating diffusion region 41. A metal layer 46 is formed on the floating diffusion region 41 for electrical connection between the gate 45 of the transistor M1 and the floating diffusion region 41.

The connection between the floating diffusion region 41 and the transistor M1 is explained below in more detail. As shown in FIG. 4, the transistor M1 is formed at an angle between about 10° and about 80° with respect to the primary axis RG of the floating diffusion region 41, most preferably at about 45°. The primary axis RG defines a direction in which the floating diffusion region 41 primarily extends. The gate 45 of the transistor M1 is electrically connected to the floating diffusion region 41 by the metal layer 46, which extends in a direction perpendicular to the primary axis RG. The gate 45 of the transistor M1 forms an angle also with respect to the first direction in which the metal layer 46 extends. Accordingly, a source 47 and a drain 48 on both sides of the gate 45 respectively form an angle with respect to the metal layer 46, which corresponds to the angle between the gate 45 and the metal layer 46. For example, if the gate 45 of the transistor M1 is formed at an angle of 45° with respect to the metal layer 46, the source 47 and the drain 48 on both sides of the gate 45, which are perpendicular to the gate 45, form an angle of 45° with respect to the metal layer 46. Therefore, an adequate space required for defining the source 47 can be secured in comparison to a signal detecting part in which the gate 45 of the transistor M1 extends in the same direction as does the metal layer 46. By forming the transistor M1 at an angle to the floating diffusion region 41, all adequate area for defining the source 47 can be secured, thereby allowing an increased conversion ratio regardless of the process design rules.

Figure 5:
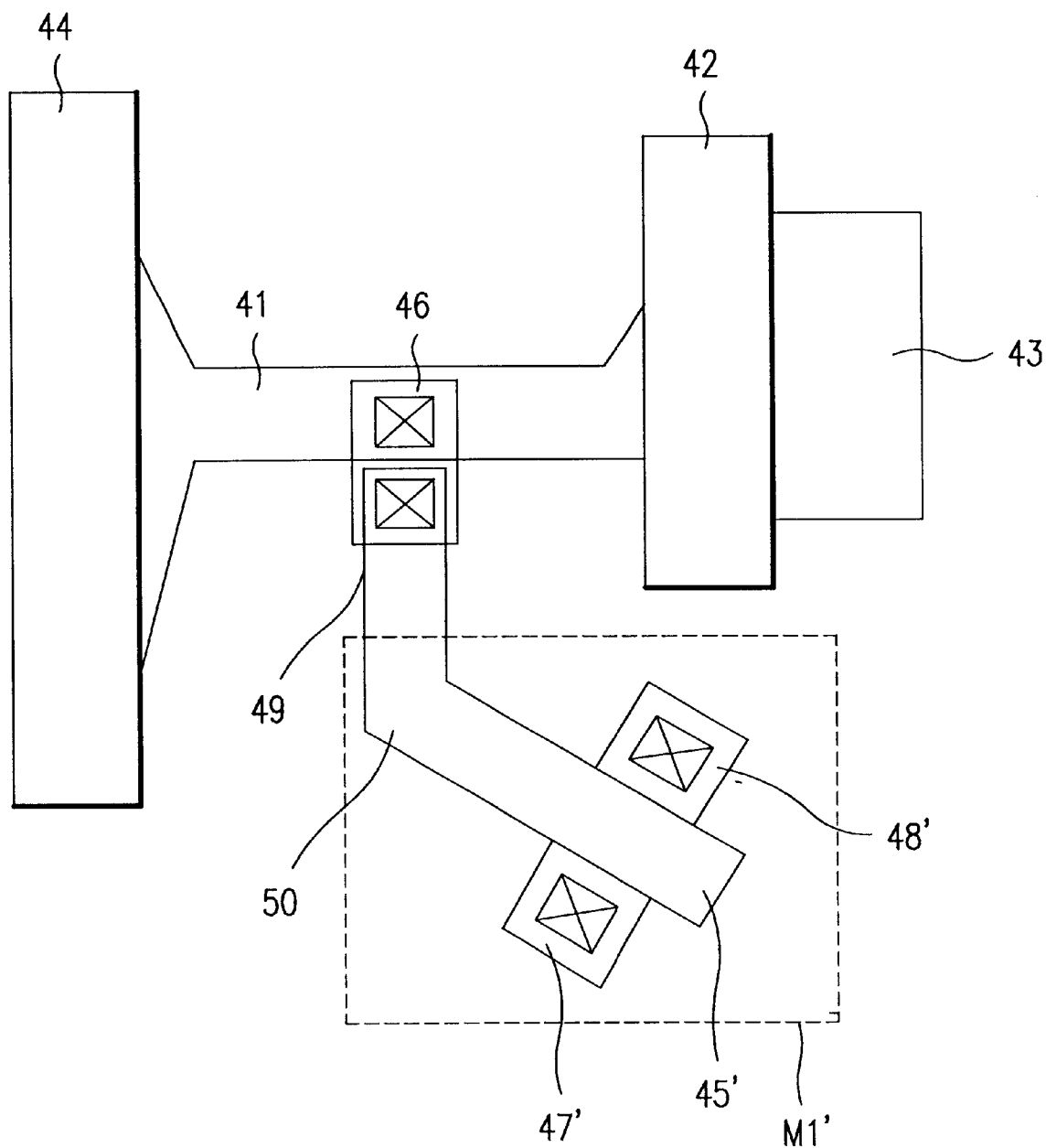
FIG. 5 illustrates a layout of a signal detecting part for a CCD in accordance with another preferred embodiments of the present invention.

In another embodiment, as shown in FIG. 5, the gate 45' of the transistor M1' has a first portion 49 connected to the metal layer 46 and a second portion 50 disposed between the source 47' and the drain 48'. The first portion 49 is formed to extend in an identical direction as the metal layer 46, and the second portion 50 is found at an angle ranging between 10° and about 80° with respect to the metal layer 46 as well as to the first part 49, preferably at about 45°. The first portion 49 and the second portion 50 are formed of polysilicon as one unit. Also, in forming the transistor M1 to be at an angle to the floating diffusion region 41, care should be taken to ensure that the size of the floating diffusion region 41 is not unnecessarily increased in order to minimize the resistance of the floating diffusion region 41.

As has been explained, the signal detecting part for a CCD of the present invention has the following) advantages. First, a sensitivity can be improved because a layout that would minimize the parasitic capacitance in the signal detecting part can be determined regardless of the design rule for a process. Second, the conversion ratio can be increased without degradation of operation and characteristics of the CCD.

It will be apparent to those skilled in the art that various modifications and variations can be made in the structure of a signal detecting part for a CCD of the present invention without departing from the spirit or scope of the invention. Thus, it is intended that the present invention cover the modifications and variations of this invention provided they come within the scope of the appended claims and their equivalents.

What is claimed is:

1. A signal detecting apparatus in a charge coupled device (CCD) having a photodiode for converting an image signal into an electrical signal charge, a vertical CCD (VCCD) for transferring the signal charge in a vertical direction, a horizontal CCD (HCCD) for transferring the vertically transferred signal charge in a horizontal direction, and a sense amplifier for sensing the signal charge transferred from the HCCD, the signal detecting apparatus comprising:

a floating diffusion region for collecting the signal charges transferred from the HCCD and detecting a voltage formed by the signal charges;

a reset gate on one side of the floating diffusion region;

a reset drain on one side of the reset gate opposite to the floating diffusion region;

an output gate formed on the other side of the floating diffusion region; and, a transistor having a gate connected to and formed at an angle with respect to a primary axis of the floating diffusion region, the angle being greater than 0° and less than 90°.

2. The signal detecting apparatus of claim 1, wherein the gate of the transistor is formed at an angle between 10° and 80° with respect to the primary axis.

3. The signal detecting apparatus of claim 2, wherein the transistor has a source and a drain formed substantially perpendicular to the gate of the transistor and at an angle of between 10° and 80° with respect to the primary axis.

4. The signal detecting apparatus of claim 1, wherein the gate of the transistor is formed at an angle of 45° with respect to the primary axis.

5. The signal detecting apparatus of claim 1, further comprising a metal layer formed on the floating diffusion region to electrically connect the gate of the transistor to the floating diffusion region.

6. A signal detecting apparatus in a charge coupled device (CCD) having a photodiode for converting an image signal into an electrical signal charge, a vertical CCD (VCCD) for transferring the signal charge in a vertical direction, a horizontal CCD (HCCD) for transferring the vertically transferred signal charge in a horizontal direction, and a sense amplifier for sensing the signal charge transferred from the HCCD, the signal detecting apparatus comprising:

a floating diffusion region for collecting the signal charges transferred from the HCCD and detecting a voltage formed by the signal charges;

a reset gate on one side of the floating diffusion region;

a reset drain on one side of the reset gate opposite to the floating diffusion region;

an output gate formed on the other side of the floating diffusion region;

a transistor having a gate connected to the floating diffusion region; and a metal layer electrically connecting the gate of the transistor to the floating diffusion region and extending in a first direction, wherein the gate of the transistor is formed at an angle greater than 0° and less than 90° with respect to the first direction.

7. The signal detecting apparatus of claim 6, wherein the gate of the transistor is formed at an angle of between 10° and 80° with respect to the first direction.

8. The signal detecting apparatus of claim 7, wherein the transistor has a source and a drain formed substantially perpendicular to the gate of the transistor and at an angle of between 10° and 80° with respect to the first direction.

9. The signal detecting apparatus of claim 6, wherein the gate of the transistor is formed at an angle of 45° with respect to the first direction.

10. A signal detecting apparatus in a charge coupled device (CCD) having a photodiode for converting an image signal into an electrical signal charge, a vertical CCD (VCCD) for transferring the signal charge in a vertical direction, a horizontal CCD (HCCD) for transferring the vertically transferred signal charge in a horizontal direction, and a sense amplifier for sensing the signal charge transferred from the HCCD, the signal detecting apparatus comprising:

a floating diffusion region for collecting the signal charges transferred from the HCCD and detecting a voltage formed by the signal charges;

a reset gate on one side of the floating diffusion region;

a reset drain on one side of the reset gate opposite to the floating diffusion region;

an output gate formed on the other side of the floating diffusion region; and a transistor having a gate connected to the floating diffusion region, the gate of the transistor having first portion connected to the floating diffusion region and a second portion extending from the first portion, wherein at least one of the first and second portions of the gate of the transistor is formed at an angle greater than 0° and less than 90° with respect to a primary axis of the floating diffusion region.

11. The signal detecting apparatus of claim 10, wherein the first portion of the gate of the transistor is formed substantially perpendicular to the primary axis, and the second portion of the gate of the transistor is formed at an angle greater than 0° and less than 90° with respect to the primary axis and to the first portion of the gate of the transistor.

12. The signal detecting apparatus of claim 11, wherein the second portion of the gate of the transistor is formed at an angle of between 10° and 80° with respect to the first portion of the gate of the transistor.

13. The signal detecting apparatus of claim 12, wherein the transistor has a source and a drain formed substantially perpendicular to the second portion of the gate of the transistor and at an angle of between 10° and 80° with respect to the first portion of the gate of the transistor.

14. The signal detecting apparatus of claim 11, wherein the second portion of the gate of the transistor is formed at an angle of 45° with respect to the first portion of the gate of the transistor.

15. The signal detecting apparatus of claim 10, further comprising a metal layer formed on the floating diffusion region to electrically connect the first portion of the gate of the transistor to the floating diffusion region.

16. A signal detecting apparatus in a charge coupled device (CCD) having a photodiode for converting an image signal into an electrical signal charge, a vertical CCD (VCCD) for transferring the signal charge in a vertical direction, a horizontal CCD (HCCD) for transferring the vertically transferred signal charge in a horizontal direction, and a sense amplifier for sensing the signal charge transferred from the HCCD, the signal detecting apparatus comprising:

a floating diffusion region for collecting the signal charges transferred from the HCCD and detecting a voltage formed by the signal charges;

a reset gate on one side of the floating diffusion region;

a reset drain on one side of the reset gate opposite to the floating diffusion region;

an output gate formed on the other side of the floating diffusion region;

a transistor having a gate connected to the floating diffusion region, the gate of the transistor having first portion connected to the floating diffusion region and a second portion extending from the first portion; and a metal layer electrically connecting the first portion of the gate of the transistor to the floating diffusion region and extending in a first direction, wherein at least one of the first and second portions of the gate of the transistor is formed at an angle greater than 0° and less than 90° with respect to the first direction.

17. The signal detecting apparatus of claim 16, wherein the first portion of the gate of the transistor is substantially parallel to the first direction, and the second portion of the gate of the transistor is formed at an angle greater than 0° and less than 90° with respect to the first direction and to the first portion of the gate of the transistor.

18. The signal detecting apparatus of claim 17, wherein the second portion of the gate of the transistor is formed at an angle of between 10° and 80° with respect to the first portion of the gate of the transistor.

19. The signal detecting apparatus of claim 18, wherein the transistor has a source and a drain formed substantially perpendicular to the second portion of the gate of the transistor and at an angle of between 10° and 80° with respect to the first portion of the gate of the transistor.

20. The signal detecting apparatus of claim 17, wherein the second portion of the gate of the transistor is formed at an angle of 45° with respect to the first portion of the gate of the transistor.

* * * * *